United States Patent
Phifer, Jr. et al.

(10) Patent No.: US 8,698,078 B2
(45) Date of Patent: Apr. 15, 2014

(54) CHARGED-PARTICLE MICROSCOPY WITH OCCLUSION DETECTION

(75) Inventors: Daniel Woodrow Phifer, Jr., Eindhoven (NL); Faysal Boughorbel, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/472,183

(22) Filed: May 15, 2012

(65) Prior Publication Data

US 2012/0292503 A1  Nov. 22, 2012

Related U.S. Application Data

(60) Provisional application No. 61/487,152, filed on May 17, 2011.

(30) Foreign Application Priority Data

May 16, 2011  (EP) .................................... 11166206

(51) Int. Cl.
*H01J 37/26* (2006.01)

(52) U.S. Cl.
USPC ........... 250/307; 250/306; 250/309; 250/310; 250/311; 382/128; 382/131; 382/154

(58) Field of Classification Search
USPC ............. 250/306, 307, 309, 310, 311, 492.1, 250/492.3; 382/128, 131, 154
See application file for complete search history.

(56) References Cited

U.S. PATENT DOCUMENTS

| | | | |
|---|---|---|---|
| 5,659,172 A | 8/1997 | Wagner et al. | |
| 6,353,222 B1 | 3/2002 | Dotan | |
| 6,472,662 B1 | 10/2002 | Archie | |
| 6,930,308 B1 | 8/2005 | Lorusso et al. | |
| 7,202,475 B1 | 4/2007 | Testoni | |

(Continued)

FOREIGN PATENT DOCUMENTS

| | | |
|---|---|---|
| EP | 2346095 | 7/2011 |
| JP | 8222172 | 8/1996 |
| JP | 9035679 | 2/1997 |
| WO | WO2010/132124 | 11/2010 |

OTHER PUBLICATIONS

Blum, Rick S. et al., "Multi-Sensor Image Fusion and Its Applications," CRC Press, ISBN 978-0-8493-3417-7, 2005.

(Continued)

*Primary Examiner* — Nicole Ippolito
(74) *Attorney, Agent, or Firm* — Scheinberg & Associates, PC; Michael O. Scheinberg; Ki O (57) ABSTRACT

This invention relates to a method of examining a sample using a charged-particle microscope. This invention solves the problem of occlusion effects, whereby a given line-of-sight behind a particular region on a sample and a given detector is blocked by a topographical feature on the sample, thus hampering detection of the emitted radiation emanating from the occluded region. This problem is solved by using at least a first and second detector configuration to detect each portion of the emitted radiation and to produce at least a first and second corresponding image based thereupon; and using computer processing apparatus to automatically compare different members of the set of corresponding images and mathematically identify on the sample at least one occlusion region with an occluded line-of-sight relative to at least one of the detector configurations.

11 Claims, 4 Drawing Sheets

(56) References Cited

U.S. PATENT DOCUMENTS

| 8,232,523 | B2* | 7/2012 | Boughorbel et al. | 250/307 |
|---|---|---|---|---|
| 2008/0240548 | A1 | 10/2008 | Yeoh et al. | |
| 2011/0204229 | A1 | 8/2011 | Schamber et al. | |
| 2011/0266440 | A1* | 11/2011 | Boughorbel et al. | 250/310 |
| 2012/0049060 | A1 | 3/2012 | Luecken et al. | |

OTHER PUBLICATIONS

Therrien, C.W. et al., "An Adaptive Technique for the Enhanced Fusion of Low-Light Visible with Uncooled Thermal Infrared Imagery," International Conference on Image Processing (ICIP '97), vol. 3 (1997), No. 1, pp. 405-408.

Press, William H. et al., "Numerical Recipes in C: The Art of Scientific Computing," Second Edition (1992).

Rheinboldt, Werner C., Methods for Solving Systems of Nonlinear Equations, Second Edition, Chapters 4-5, published by SIAM (1998) (ISBN0-8971-415-X).

Savarese, S. et al., "Shadow Carving," Proc. of the International Conference on Computer Vision (ICCV), Vancouver, Canada, 2001.

Bouguet, J. et al., "3D photography using shadows in dual-space geometry," International Journal of Computer Vision (IJCV), vol. 35, pp. 129-149, 1999.

Savarese, S., "Shape Reconstruction from Shadows and Reflections," California Institute of Technology, Pasadena, California, 2005.

Sammon, J., "A Nonlinear Mapping for Data Structure Analysis," IEEE Transactions on Computers, vol. C-18, No. 5, May 1969.

Sharma, K. et al., "Bayesian sensor image fusion using local linear generative models," Optical Engineering, vol. 40, No. 7, pp. 1364-1376, Jul. 2001.

Frankot, R. et al., "A Method for Enforcing Integrability in Shape from Shading Algorithms," IEEE Transactions on Pattern Analysis and Machine Intelligence, vol. 10, No. 4, pp. 439-451, Jul. 1988.

Zitova, B. et al., "Image registration methods: A survey," Image and Vision Computing, vol. 21, pp. 997-1000, 2003.

\* cited by examiner

CHARGED-PARTICLE MICROSCOPY WITH OCCLUSION DETECTION

This application claims priority from U.S. Provisional Patent Application 61/487,152 filed May 17, 2011, which is hereby incorporated by reference.

The invention relates to a method of examining a sample using a charged-particle microscope, comprising the following steps:

Mounting the sample on a sample holder;
Using a particle-optical column to direct at least one beam of particulate radiation onto the sample, thereby producing an interaction that causes emitted radiation to emanate from the sample;
Using a first detector configuration $C_1$ to detect a first portion of the emitted radiation and produce a first image $I_1$ based thereupon.

The invention also relates to a charged-particle microscope in which such a method is performed.

As used throughout this text, the ensuing terms should be interpreted as follows:

The term "charged particle" refers to an electron or ion (generally a positive ion, such as a Gallium ion or Helium ion, for example).

The term "microscope" refers to an apparatus that is used to create a magnified image of an object, feature or component that is generally too small to be seen in satisfactory detail with the naked human eye. In addition to having an imaging functionality, such an apparatus may also have a machining functionality; for example, it may be used to locally modify a sample by removing material therefrom ("milling" or "ablation") or adding material thereto ("deposition"). Said imaging functionality and machining functionality may be provided by the same type of charged particle, or may be provided by different types of charged particle; for example, a Focused Ion Beam (FIB) microscope may employ a (focused) ion beam for machining purposes and an electron beam for imaging purposes (a so-called "dual beam" microscope, or "FIB-SEM"), or it may perform machining with a relatively high-energy ion beam and perform imaging with a relatively low-energy ion beam. On the basis of this interpretation, tools such as the following should be regarded as falling within the scope of the current invention: electron microscopes, FIB apparatus, EBID and IBID apparatus (EBID=Electron-Beam-Induced Deposition; IBID=Ion-Beam-Induced Deposition), etc.

The term "particle-optical column" refers to a collection of electrostatic and/or magnetic lenses that can be used to manipulate a charged-particle beam, serving to provide it with a certain focus or deflection, for example, and/or to mitigate one or more aberrations therein.

The term "detector" should be broadly interpreted as encompassing any detection set-up used to register (one or more types of) emitted radiation emanating from a sample. Such a detector may be unitary, or it may be compound in nature and comprise a plurality of sub-detectors, e.g. as in the case of a spatial distribution of detector units about a sample table, or a pixelated detector.

The term "detector configuration" is intended to refer to a specific geometric position/orientation of a (sub-)detector with respect to the sample, in six degrees of freedom (e.g. x, y, z, Rx, Ry, Rz—the last three rotational degrees of freedom also conventionally referred to as roll, pitch and yaw). Consequently, such a detector configuration may be altered by changing the relative position/orientation of the sample with respect to said (sub-)detector.

The term "image" should be broadly interpreted as encompassing not just the conventional concept of an image, but also concepts such as a spectrograph or map, for example. Basically, an image in the current context is a map of (a portion of) the sample that can be constructed using data output from the employed detector and that renders a value of a sample-related spatial variable—such as intensity, contrast, density variation, atomic weight, staining concentration, electron yield/X-ray yield, etc.——as a function of position on the sample.

In what follows, the invention will—by way of example—often be set forth in the specific context of electron microscopes. However, such simplification is intended solely for clarity/illustrative purposes, and should not be interpreted as limiting.

Electron microscopy is a well-known technique for imaging microscopic-objects. The basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" beam of ions, allowing supportive activities such as ion-beam milling or ion-beam-induced deposition, for example. In traditional electron microscopes, the imaging beam is "on" for an extended period of time during a given imaging session; however, electron microscopes are also available in which imaging occurs on the basis of a relatively short "flash" or "burst" of electrons, such an approach being of potential benefit when attempting to image moving samples or radiation-sensitive specimens, for example.

When a beam of particulate radiation (such as an electron beam or ion beam) impinges on a sample, it generally interacts with the sample in a manner that causes different types of emitted radiation to emanate from the sample. Such emitted radiation may, for example, comprise Secondary Electrons (SEs), Backscatter Electrons (BEs), visible/infrared/ultraviolet light (fluorescence and cathodoluminescence) and X-rays. With regard to these different radiation types, the following can be noted:

Electrons are relatively easy and cheap to detect, e.g. using a scintillator in conjunction with a photomultiplier tube (PMT) or silicon photomultiplier (SiPM—also sometimes called a Multiple Pixel Photon Counter), or using a solid state detector such as that shown in FIG. 2 below.

The detection of visible/infrared/ultraviolet light is also relatively straightforward, and can be performed using a PMT or SiPM (without scintillator), or a photodiode cell, for example.

X-ray detectors tend to be relatively expensive and slow, and generally offer a relatively limited field of view. Nevertheless, there are charged-particle microscopy applications in which the detection and analysis of emitted X-rays from a sample can be very desirable. For example, analysis of such X-rays yields information on the X-ray bands of excited atoms/molecules in a sample, thus allowing an elemental/compositional analysis of the sample's constitution. This can be of use in many material investigations in which two or more materials co-exist in a sample.

A particular application of charged-particle microscopy is in the field of mineralogy (and the associated fields of geology, mining and petroleum exploration), in which it is desirable to glean information on both the physical structure of a sample (grain size, grain shape, grain orientation, porosity, presence of shock fractures, etc.) and the chemical composition of a sample (elements/isotopes present, and in what molecular configurations they manifest themselves). A problem with mineralogical samples, however, is that they generally tend to demonstrate substantial surface relief/roughness/topography. This can lead to significant occlusion (obscuration) effects, whereby a given line of sight between a particular region R on the sample and a given detector D is blocked by a topographical feature on the sample, thus hampering detection by D of emitted radiation emanating from R. One can attempt to mitigate this problem by embedding the sample in a resin block and then performing a polishing operation so as to expose a (somewhat) smoothened face of the sample, but such an approach tends to be cumbersome and time-consuming (and, accordingly, relatively expensive), and can detrimentally influence the state of the sample in question. These problems are not limited to mineralogical samples: similar issues can also occur for non-mineralogical samples, such as certain biological specimens (e.g. bone or tooth enamel, or shells of crustaceans) and materials-science samples (e.g. metals containing suspected fractures, coatings, composites), for instance.

Occlusion effects can have the gravest effect in configurations in which the detector D is a relatively small, fixed, unitary detector (as is often the case in X-ray detection, for example), since such configurations offer limited options for circumventing an occluded line of sight. However, even in scenarios in which D is a sub-detector in a distributed array A of such detectors (e.g. as in the case of segmented solid-state electron detectors or "clouds" of SiPMs), occlusion effects may still adversely affect the usefulness of a subset of the detectors in A.

It is an object of the invention to address this issue. More specifically, it is an object of the invention to provide a method of examining a sample using a charged-particle microscope whereby certain effects of sample topography/relief can be mitigated. In particular, it is an object of the invention to provide such a method whereby topography-associated line-of-sight occlusion issues can be identified and quantified. It is a further object of the invention that such a method should allow a sample with surface relief/roughness to be more satisfactorily analyzed on the basis of X-rays emanating from the sample.

These and other objects are achieved in a method as specified in the opening paragraph, characterized by the following steps:

Using at least a second detector configuration C2 to detect a second portion of the emitted radiation and produce a second image I2 based thereupon, whereby C2 is different to C1, thus compiling a set SD={C1, C2} of detector configurations and a set SI={I1, I2} of corresponding images;

Using computer processing apparatus to automatically compare different members of SI and mathematically identify on the sample at least one occlusion region with an occluded line of sight relative to at least one member of SD.

In specific research that ultimately led to the current invention, the inventors were performing X-ray-based (compositional/elemental) analysis of a mineralogical sample with substantial surface topography. Although at that time not particularly interested in non-X-ray emitted radiation emanating from the sample, they arrived at the realization that such radiation could nevertheless be of use in analyzing occlusion of X-rays caused by specific sample topography. Because such non-X-ray radiation was generally detected using a different detector configuration to that used in detecting X-rays, this afforded a change of detection perspective that allowed investigation/comparison of different lines-of-sight between sample and employed detector. On this basis, the inventors developed a mathematical framework by means of which detection results along different lines-of-sight could be automatically processed, and surface occlusion information distilled therefrom. Generalizing this approach, they realized that they only needed different detector configurations—not necessarily different detector types or radiation types—in order to apply the newly developed technique. In such different detector configurations, members of $S_D$ could, for example, differ from one another in (at least) one of the following manners:

Each employs a different detector in a different fixed position with respect to the sample holder. This is the situation in the case of a "cloud" of SiPMs, or of the segmented solid-state detector of FIG. 2, for example (but it is also typically the case when one uses different kinds of detection (e.g. X-ray detection and electron detection), since the detectors in such a case will generally not spatially coincide).

Each employs the same detector, but moved into a different relative position/orientation with respect to the sample. Such a situation could, for example, be achieved by tilting/rotating the sample holder with respect to a single, small-area detector, and/or by mounting such a detector on a structure that allows the detector itself to be moved into different stances with respect to the sample holder.

The first of these scenarios has the significant advantage that it accumulates members of $S_I$ in a simultaneous rather than a sequential fashion, in that several detector configurations are concurrently "active" during an irradiation session of the sample. Consequently, the sample incurs relatively little radiation damage, and the whole data set is accrued relatively quickly. This can be of significant benefit in the case of very radiation-sensitive samples, or where availability of time is an issue.

In order to automatically infer the presence of an occluded region in a given test image IT, the method according to the present invention compares IT to another image I'T (both in SI), whereby both images IT and I'T (at least partially) pertain to the same portion of the sample S, and, if necessary, are first mutually translated/scaled/rotated (i.e. brought into mutual "registration") so as to allow one to be accurately aligned with/superimposed upon the other. Thereafter, the invention makes use of the fact that an occluded region in IT will reveal itself via at least one of:

An area of reduced correlation between $I_T$ and $I'_T$;

An area of reduced intensity in $I_T$ relative to $I'_T$.

This approach can be applied to any pair of images $I_T$ and $I'_T$ in $S_I$, whereby it should be explicitly noted that—via additional measurements at additional detector configurations—the cardinality (i.e. number of members) of $S_D$ and $S_I$ can be extended to values (significantly) greater than two. For more information on image registration, reference is made to Section 5 in Embodiment 2 below, although the skilled artisan will be familiar with this topic.

In a refinement of, and/or supplement to, the technique set forth in the preceding paragraph, an embodiment of the current invention employs the following approach:

Plural members of $S_I$ are mathematically fused into a composite reference image $I_F$;

A test image $I_T$ is once again selected from $S_I$;

This time, an occlusion region is identified by comparing $I_T$ to the fused reference image $I_F$, and (analogous to what is explained above) identifying an area in $I_T$ in which at least one of the following is observed:
  A reduced correlation between $I_T$ and $I_F$;
  A reduced intensity in $I_T$ relative to $I_F$.
This approach has a number of advantages. For example:
  In addition to identifying regions of occlusion in the various individual members of $S_I$, one also compiles a composite image $I_F$ in which such occlusion regions are (at least to a certain degree) eliminated. This is because a region that is occluded in one image may not be occluded in another image, whence the process of fusing different images effectively "erases" such occlusion areas in the fused resultant. So the tool user accrues a final image in which occlusion is eliminated or, at least, mitigated.
  It is generally easier/more efficient to compare given members of $S_I$ to the same reference image ($I_F$) each time.

There are various mathematical techniques by means of which the fusion referred to in the previous paragraph can be performed. For example, one may employ methods such as Non-Linear Direct Fusion or Bayesian Fusion. For more information on this subject, reference is made to Embodiment 2 below.

It should be noted that the occlusion identification afforded by the current invention can be both qualitative and quantitative in nature. This is because:
  On the one hand, the mere presence of the aforementioned reduction in correlation and/or intensity when performing a comparison between $I_T$ and at least one of $I_F$ and $I'_T$ allows a qualitative determination of the presence of occlusion.
  On the other hand, the extent of such occlusion can also be calculated. For example:
    One can compare an observed degree of correlation and express it as a percentage of perfect/total correlation.
    One can compare an observed intensity with a reference intensity (e.g. an average intensity taken over the whole area of $I_F$), and then express the former as a fraction of the latter.

If desired, these results can be graphically displayed for the tool user (e.g. on a display device, such as an LCD screen). For instance, in a given image, an occlusion region could be depicted in a given color, or pointed out using an arrow, or denoted using a given symbol or outline shape. On the other hand, a magnitude of such occlusion could be depicted using degree/shade of color, for example, or by depicting a (stylized) graph of degree of occlusion in a sub-window, etc.

Once the inventive technique has been employed to identify one or more regions of occlusion in a particular image in $S_I$, this information can be used in different ways. For example, for a given region R on the sample, the computer processing apparatus can automatically perform at least one of the following actions:
  (i) Indicate a member of the set $S_D$ that suffers from greatest occlusion in respect of R;
  (ii) Indicate a member of the set $S_D$ that suffers from least occlusion in respect of R;
  (iii) Infer a new detector configuration C' that is not an existing member of $S_D$ and that is predicted to give lower occlusion in respect of R than any existing member of $S_D$.

In this context, the following can be noted:
  As regards (i) and (ii), the tool user can elect (to the extent possible, and for the particular sample in question) to avoid detector configurations that suffer to a relatively great extent from sample surface occlusion and instead opt for detector configurations that suffer to a lesser extent from such occlusion.
  As regards (iii), the computer processing apparatus could use the accumulated data $S_D$, $S_I$ and $I_F$ to construct a (parametrized) predictive model of occlusion versus detector configuration at a generalized region on the sample in question, and could approximately calculate (inter alia using extrapolation/interpolation, for example) a detector configuration that would suffer to a reduced extent from occlusion effects in respect of a particular region on the sample (Cost Function approach). The tool user could then, if desired, manually try out the suggested detector configuration, or the computer processing apparatus could automatically enact the adjustments required to achieve the suggested configuration (e.g. by adjusting the geometrical position/attitude of the sample holder, and/or moving a given detector, and/or choosing a particular sub-detector in a distributed detector arrangement).

One should remember that there may be situations in which a tool user does not have the luxury of performing an extensive examination of a sample using (many) further different detector configurations, e.g. because of the risk/effects of cumulative radiation damage to the sample, and/or because of constraints on available time/resources, etc. In such instances, one may just have to put up with the occlusion effects present in a limited batch of measurements already accumulated. In that case, as regards the image obtained using a given detector configuration, the tool user can simply note the location of occlusion-flagged areas and bear in mind that data interpretation in such areas may not be optimally reliable. In this respect, use of the fused image $I_F$ referred to above will generally entail least hindrance as regards interpretation/use of accumulated data.

In a further aspect of the present invention, the occlusion information obtained using the methodologies set forth above can be used to calculate the topography of (at least parts of) the surface of the sample. This point can be elucidated as follows.
  Theoretically, on the basis of a single image captured at a single detector configuration, one could use a (supposed) region of occlusion as a basis for a (very) limited inference of the surface topography causing said occlusion, subject to (relatively severe) constraints. This can be achieved using a known technique such as Shape From Shadows, for example. For more information on this rather esoteric approach, one may refer to the following publications:
    S. Savarese, H. Rushmeier, F. Bernardini and P. Perona, *Shadow Carving*, Proc. of the International Conference on Computer Vision (ICCV), Vancouver, Canada, 2001.
    J-Y Bouguet and P. Perona, 3*D Photography Using Shadows in Dual-Space Geometry*, International Journal of Computer Vision (IJCV), Vol. 35(2), pp. 129-149, 1999.
    S. Savarese, *Shape Reconstruction from Shadows and Reflections*, Caltech, 2005.
  In contrast, the current invention provides multiple images captured at multiple detector configurations, and enables a far more accurate calculation of the sample topography associated with (i.e. deemed to be at least partially the cause of) the identified region(s) of occlusion, using a technique such as Photometric Stereo (or a variant thereof), for example. Examples of such mathematical topography reconstruction are presented in the Embodiments below.

As already set forth above, there is an advantage to simultaneously detecting different radiation types emanating from a sample, in that one thus tends to cause less radiation-induced damage to the sample, and to accrue a data set more quickly. There are also other potential benefits: for example, fluxes of electrons (BEs and/or SEs) from an irradiated sample generally tend to be quite strong, thus yielding a relatively good signal-to-noise ratio, whereas X-rays lend themselves particularly to compositional analysis of a sample, for instance. Consequently, a beneficial embodiment of the current invention is characterized in that at least two different members of $S_D$ are used to correspondingly detect at least two different types of emitted radiation [e.g. X-rays (or fluorescence light, for instance) in one case, and electrons (or (secondary) ions, for instance) in another other case]. Scanning-based microscopes—such as SEMS and STEMs—often feature simultaneous detection of different types of emitted radiation using a variety of detectors.

The current invention is of particular significance in the context of X-ray investigations of samples (for the various reasons already elucidated above). In this context, it should be noted that various different types of such X-ray investigations lend themselves to application in the invention. For example, Energy Dispersive Spectroscopy (EDS) and Wavelength Dispersive Spectroscopy (WDS) are popular analysis techniques, whereby:

In EDS, an incoming high-energy charged particle knocks an inner-shell electron out of an atom in the target, creating an electron hole; an outer-shell electron in the atom then de-excites and fills the hole, releasing its energy surplus as an X-ray photon. The number and energy of X-rays thus emitted is measured using an energy-dispersive spectrometer.

WDS differs from EDS in that it uses diffraction patterns arising from radiation/matter interaction as its raw data. It generally has a finer spectral resolution that EDS, and is also less sensitive to the effects of artifacts, such as false peaks and amplifier noise; however, a drawback of the technique is that it can analyze only one element at a time, making it generally significantly slower than EDS.

BRIEF DESCRIPTION OF THE DRAWINGS

The invention will now be elucidated in more detail on the basis of exemplary embodiments and the accompanying schematic drawings, in which.

In the Figures, corresponding parts are indicated using corresponding reference symbols.

Embodiment 1

Figure 1A:
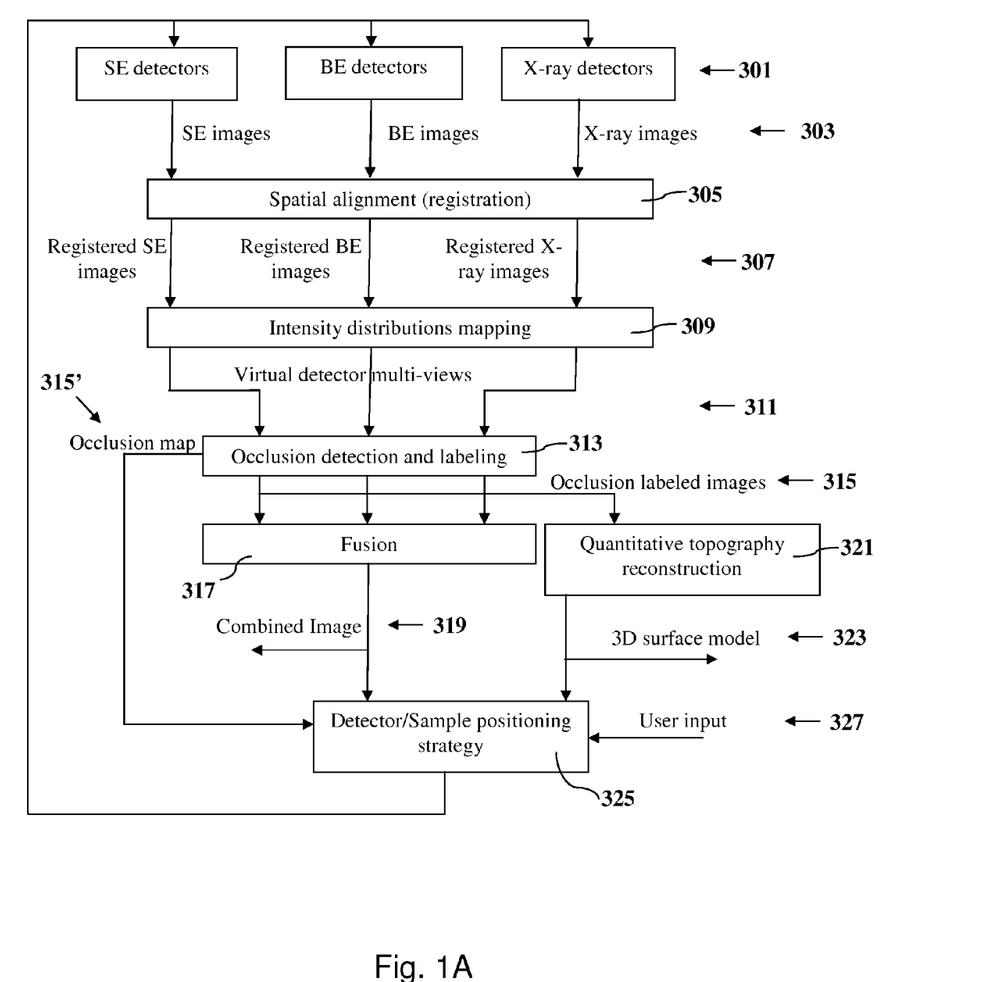
FIG. 1A shows a flowchart that illustrates various aspects of an embodiment of a method according to the current invention.

FIG. 1A shows a flowchart that illustrates various aspects of an embodiment of a method according to the current invention, performed in a charged-particle microscope. Various levels and steps in this flowchart can be elucidated as follows:

Level 301: Shows various classes of detector whose output may serve as the basis for forming images of an irradiated sample at various different detector configurations. Each of the indicated detector classes can detect a particular type of emitted radiation emanating from a sample when struck by a charged-particle beam. Apart from the depicted detector classes, other detector classes are also possible, e.g. to detect ions or optical radiation (infrared/visible/ultraviolet radiation), for example. One may elect to use one or more of these various detector classes to compile a set of images.

Level 303: The various (raw) images produced from the various detectors at level 303 are represented here.

Step 305: The (raw) images at level 303 are subjected to a mathematical spatial alignment/registration step, to address any mutual scaling/shift/rotation differences that may be present.

Level 307: The duly processed, registered images resulting from step 305 are represented here.

Figure 1B:
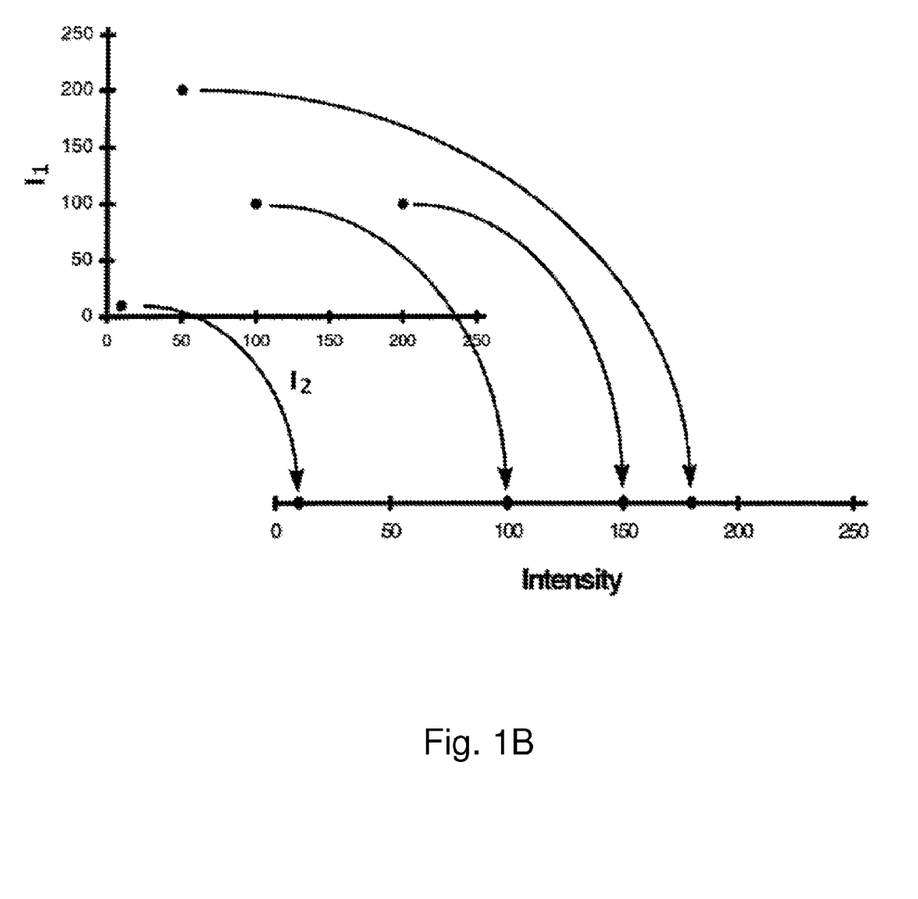
FIG. 1B illustrates a particular type of structure-preserving mathematical mapping from two-dimensional (2D) space to one-dimensional (1D) space, employed in a specific embodiment of a method according to the current invention.

Step 309: This step is optional, and should be seen as a precursor to/part of a particular embodiment of an image fusion operation as alluded to in step 317 below. The registered images at level 307 are subjected to a mathematical mapping operation—such as a mapping from a 2D intensity space to a 1D intensity space, with preservation of relative distance/structure (see FIG. 1B and the discussion in the next Embodiment). A mapping of this type is of relevance when one uses a fusion technique such as Non-Linear Direct Fusion, as opposed to Bayesian Fusion, for example. With specific reference to FIG. 1B:

The upper left portion of the Figure shows a 2D intensity space in which the axes express pixel intensity for two different images—$I_1$ (vertical axis) and $I_2$ (horizontal axis). The depicted space shows four exemplary points, which have (generally) different intensities in each of the different images $I_1$, $I_2$.

The lower right portion of the figure shows the result of mapping the depicted points in the 2D space onto a single intensity axis (1D space). In this particular, illustrative mapping, for any given point, its position on the depicted single intensity axis is the additive average of its intensities on the vertical and horizontal axes of the depicted 2D space [so that $I=\frac{1}{2}(I_1+I_2)$]; however, many other mappings are possible, and the illustrated case should not be interpreted as limiting.

Level 311: The outputs of step 309 are virtual views that more readily lend themselves to subsequent mathematical processing.

Step 313: Pairs of the virtual views at level 311 are compared to one another so as to reveal regions of occlusion (using intensity/correlation referencing).

Level 315: The occlusion-labeled images emerging from step 313 can be used to create an occlusion map (item 315'). Alternatively/additionally, they can be subjected to further processing.

Step 317: If desired, the images at level 315 can be mathematically fused into a "combined" image 319. It should be noted that, in an alternative embodiment, this fusion step 317 could have been performed prior to step 313, and used as a (partial) basis for the occlusion labeling process at step 313.

Step 321: The occlusion-labeled images resulting from step 313 can be used as input to (at least partially) calculate the surface topography of the sample responsible for causing the observed occlusion in the first place. Such a procedure will lead to a three-dimensional (3D) surface model 323 of the sample.

Step 325: The outputs of the fusion step 317 and topography reconstruction step 321, as well as the occlusion map 315' and possible supplementary user input 327, can be used as inputs to a strategy-determining step 325, whose aim is to decide a new detector configuration with which to perform a follow-up measurement.

Embodiment 2

A detailed mathematical dissertation relating to the current invention will now be presented.

1. Occlusion Detection

Occluded areas in (SEM) imagery are characterized by a relatively large drop in intensity in each occluded area for the detector configuration concerned. Significant information from each such area will be missing. In the case of multiple detectors positioned in different locations around a sample, a region occluded for one detector configuration is likely to be visible in others. Based on this fact, a method that checks the correlation (amount of mutual information) of local patches in one image with corresponding patches in the images obtained using other detector configurations will record a lower correlation than average. Using these two criteria (unusually low brightness+relatively low cross-image correlation) one can design a robust occlusion detection method. For each position on a sample, one can label the most likely occluded areas, and then use this information in a follow-on fusion step and in planning subsequent microscope stage moves.

2. Fusing Images from Different Detector Configurations

In what follows, two different image fusion techniques will be presented. It should be noted, however, that several other fusion methods can alternatively be used. An overview of image fusion methods can, for example, be found in the following publication:

[1] Rick S. Blum and Zheng Liu (eds), *Multi-Sensor Image Fusion and Its Applications*, CRC Press, ISBN 978-0-8493-3417-7, 2005.

2a. Non-Linear Direct Fusion

For this task, we make use of the so-called Sammon mapping, which is elucidated, for example, in the following publications:

[2] J. W. Sammon, *A non-linear mapping for data structure analysis*, IEEE Transactions on Computers, C-18:401-409, May 1969.

[3] C. W. Therrien, J. W. Scrofani, W. K. Kreb, *An Adaptive Technique for the Enhanced Fusion of Low-Light Visible with Uncooled Thermal Infrared Imagery*, International Conference on Image Processing (ICIP '97), Vol. 3 (1997), No. 1, pp. 405-408.

This mapping consists of a non-linear transformation that reduces higher-dimensional datasets into lower-dimensional ones while preserving the internal structure of the mapped datasets (see FIG. 1B). This is achieved by imposing the constraint that distances between data points in the higher-dimensional space be preserved in the mapping. For non-linear mapping from 2D to 1D space, the corresponding cost/stress function is:

$$\varepsilon = \frac{1}{\sum_{i<j} d_{ij}^*} \sum_{i<j}^{N} \frac{[d_{ij}^* - d_{ij}]^2}{d_{ij}^*} \quad (1)$$

in which $d_{ij}^*$ and $d_{ij}$ are, respectively, the distances in 2D and 1D intensity space, and N is the number of pixels considered (the common size in pixels of the fused image).

Since the fusion of two images in the context of the present invention can be seen as a mapping from 2D to 1D intensity space, Sammon's mapping can be applied to the task at hand, as follows.

For the fusion transformations, one uses nonlinear (NL) mappings of the form:

$$F(I_1, I_2) = NL(I_1, I_2) \quad (2)$$

For example:

$$F(I_1, I_2) = (p_1 + p_2 I_1 + p_3 I_1^2)(p_4 + p_5 I_2 + p_6 I_2^2) \quad (3)$$

Other NL mappings can be considered as well.

For intensities ranging from 0 to M, one minimizes the parameterized Sammon criterion:

$$\varepsilon(p) = \frac{1}{\sum_{i<j} d_{ij}^*} \sum_{i<j}^{N} \frac{[d_{ij}^* - d_{ij}(p)]^2}{d_{ij}^*} \quad (4)$$

wherein:

$$p = (p_1, p_2, \ldots, p_6)^T \quad (5)$$

the suffix T being standard mathematical nomenclature for a matrix/vector Transverse.

This minimization problem is subject to the following constraints:

$$\begin{cases} F(0, 0) = 0 \\ F(M, M) = M \\ \frac{\partial F(I_1, I_2)}{\partial I_1} \geq 0 \\ \frac{\partial F(I_1, I_2)}{\partial I_2} \geq 0 \end{cases} \quad (6)$$

$$d_{ij}^* = [(I_1(i) - I_1(j))^2 + (I_2(i) - I_2(j))^2]^{\frac{1}{2}} \quad (7)$$

$$d_{ij}(p) = |F(I_1(i), I_2(i); p) - F(I_1(j), I_2(j); p)| \quad (8)$$

Random sampling of the distance pairs is used in the optimization process, so that computations are manageable during the optimization. Another possibility for reducing the number of pairs involved is to use K-means clustering in the 2D space. A variety of non-linear constrained optimization methods can be used to solve for the parameter vector p.

One can also use another approach (proposed in the aforementioned Sammon reference [2]), where one starts with an initial mapping, which can be random, from an N-dimensional space (where N can be higher than 2 if one needs to fuse more than two images) to a 1-dimensional space, where the mapped image pixels are:

$$\{r_i\}, i = 1, 2, \ldots, N; r_i \in R \quad (9)$$

An iterative scheme can be used to minimize the criterion (1), now estimated at iteration m as:

$$\varepsilon(m) = \frac{1}{\sum_{i<j} d_{ij}^*} \sum_{i<j}^{N} \frac{[d_{ij}^* - d_{ij}(m)]^2}{d_{ij}^*} \quad (10)$$

The gradient-based update formula used to update each sample $r_l$ is given by the formula:

$$r_l(m+1) = r_l(m) - \alpha \Delta_l(m) \qquad (11)$$

in which:

The so-called learning parameter $\alpha$ is chosen from experiments, and is typically set to a value around 0.3 and:

$$\Delta_l(m) = \frac{\frac{\partial E(m)}{\partial r_l(m)}}{\left|\frac{\partial^2 E(m)}{\partial r_l(m)^2}\right|} \qquad (12)$$

where:

$$\frac{\partial E(m)}{\partial r_l(m)} = -\frac{2}{\sum_{i<j}^N d_{ij}^*} \sum_{\substack{j=1 \\ j \neq l}}^N \frac{d_{lj}^* - d_{lj}}{d_{lj}^* d_{lj}} (r_l - r_j) \qquad (13)$$

and:

$$\frac{\partial^2 E(m)}{\partial r_l(m)^2} = -\frac{2}{\sum_{i<j}^N d_{ij}^*} \sum_{\substack{j=1 \\ j \neq l}}^N \frac{1}{d_{lj}^* d_{lj}} \left[ (d_{lj}^* - d_{lj}) - \frac{(r_l - r_j)^2}{d_{lj}} \left(1 + \frac{d_{lj}^* - d_{lj}}{d_{lj}}\right) \right] \qquad (14)$$

During the iterative process, two points in the N-dimensional set are selected at random and their projections are updated using equations (11) to (14).

2b. Bayesian Fusion

Image formation for detector configuration i can be modelled as follows:

$$I_i(x,y) = \beta_i(x,y) S(x,y) + \alpha_i(x,y) + n_i(x,y) \qquad (15)$$

which is a formulation that includes a sensor gain ($\beta$), a spatially varying offset ($\alpha$) and a noise term (n).

This can be written in matrix notation as:

$$I = \beta S + \alpha + n \qquad (16)$$

where the vectors (bold type) contain all u locations in the image concerned (u is an integer). It is common to use the assumption of uncorrelated noise in the various images, which gives a diagonal noise covariance matrix:

$$\Sigma_n = \text{diag}[\sigma_{n_1}^2, \sigma_{n_2}^2, \ldots, \sigma_{n_u}^2]$$

The noise is also assumed to be independent of specific sample properties. At each spatial position (x,y), the sample is modelled by a random Gaussian variable S(x,y), whose values at each position (x,y) are mutually independent, and whose local mean (over a small local patch) and variance are expressed as $S_0(x,y)$ and $\sigma_S(x,y)^2$, respectively. This total model can express local polarity reversals, spatial variation of sensor gain, and noise. Given detector intensities I, we can estimate the sample surface S using a Bayesian framework. The variables and noise are assumed to be Gaussian. At a detector, the so-called Conditional Density P(I|S,x,y) as well as the so-called Posterior Density P(S|I,x,y) are both Gaussian (whereby it should be noted that the nomenclature P(A|B) is a standard way of expressing the probability of distilling A given B as input). The fusion can be performed using either of:

A so-called maximum likelihood (ML) method, which seeks $\max_S P(I|S,x,y)$;

A so-called maximum à posteriori (MAP) method, which seeks $\max_S P(S|I,x,y)$.

The solutions can be derived as:

$$S_{MAP} = \left[\beta^T \sum_n^{-1} \beta + \frac{1}{\sigma_S^2}\right]^{-1} \left(\beta^T \sum_n^{-1} (I - \alpha) + \frac{S_0}{\sigma_S^2}\right) \qquad (17)$$

and:

$$S_{ML} = \left[\beta^T \sum_n^{-1} \beta\right]^{-1} \left(\beta^T \sum_n^{-1} (I - \alpha)\right) \qquad (18)$$

The model parameters $\alpha$ and $\beta$ can be estimated from local image intensity statistics. One can compute from the image formation model the mean and variance over a small image region, and use a least square fit to measured image statistics, e.g. as elucidated in the following reference:

[4] R. K. Sharma, T. K. Leen and M. Pavel, *Bayesian sensor image fusion using local linear generative models*, Optical Engineering 40(07), 1364-1376, July 2001.

In many cases, one may be able to model the image formation on the basis of the simpler model:

$$I = \beta S + n \qquad (19)$$

thus substantially simplifying the solutions set forth above.

3. Depth Measurement Algorithms

Typically, from a single type of detector such as a BE detector, one can estimate the surface topography of a sample by relying on a Lambertian image formation model:

$$I(i) = \vec{l}(i) \cdot \vec{n}(i) \qquad (20)$$

in which I(i) represents the (normalized) observed images obtained from the different detector configurations. The vectors $\vec{l}(i)$ represent the directions from sample to detector, and $\vec{n}(i)$ are surface normals (all of which are variables at location i).

For at least three detectors this leads to a linear system:

$$\begin{cases} I_1(i) = l_x^1(i) \cdot n_x(i) + l_y^1(i) \cdot n_y(i) + l_z^1(i) \cdot n_z(i) \\ I_2(i) = l_x^2(i) \cdot n_x(i) + l_y^2(i) \cdot n_y(i) + l_z^2(i) \cdot n_z(i) \\ I_3(i) = l_x^3(i) \cdot n_x(i) + l_y^3(i) \cdot n_y(i) + l_z^3(i) \cdot n_z(i) \end{cases} \qquad (21)$$

which is solved under the constraint $\|\vec{n}(i)\| = 1$.

The normals are related to surface gradients p and q by the following relationships:

$$p = -\frac{n_x}{n_z} \qquad (22)$$

$$q = -\frac{n_y}{n_z} \qquad (23)$$

Due to possible errors in the estimation of the normals, it is not guaranteed that p and q (noisy estimates of $$\left(\text{noisy estimates of } \frac{\partial Z}{\partial x} \text{ and } \frac{\partial Z}{\partial y}\right)$$

will be integrable into a physical surface. It is common to approach the task of recovering a feasible surface by searching for the minimum of the following variational criterion:

$$J(Z) = \int\int \left(\left(\frac{\partial Z}{\partial x} - p\right)^2 + \left(\frac{\partial Z}{\partial y} - q\right)^2\right) dx dy \qquad (24)$$

The associated Euler-Lagrange equation (used to find a minimum of the least square fit) leads to the Poisson equation:

$$\frac{\partial^2 Z}{\partial x^2} + \frac{\partial^2 Z}{\partial y^2} = div(p, q) \qquad (25)$$

where:

$$div(p, q) = \frac{\partial p}{\partial x} + \frac{\partial q}{\partial y} \qquad (26)$$

The key equation to solve for surface recovery is then:

$$\frac{\partial^2 Z}{\partial x^2} + \frac{\partial^2 Z}{\partial y^2} = \frac{\partial p}{\partial x} + \frac{\partial q}{\partial y} \qquad (27)$$

This needs to be solved while enforcing integrability on the surface. One of the most common ways to achieve this is to use Fourier-based integration, e.g. as elucidated in the following reference:

[5] R. T. Frankot and R. Chellappa, *A method for enforcing integrability in shape from shading algorithms*, IEEE Transactions on Pattern Analysis and Machine Intelligence, Vol. 10, pp. 439-451, July 1988.

By applying Fourier transform to both sides of equation (27) one obtains:

$$\mathcal{F}\left(\frac{\partial^2 Z}{\partial x^2} + \frac{\partial^2 Z}{\partial y^2}\right) = \mathcal{F}\left(\frac{\partial p}{\partial x} + \frac{\partial q}{\partial y}\right) \qquad (28)$$

which yields:

$$-(\omega_x^2 + \omega_y^2)\mathcal{F}(Z) = i\omega_x \mathcal{F}(p) + i\omega_y \mathcal{F}(q) \qquad (29)$$

where $\omega_x$, $\omega_y$ are the frequency space indices. From (29), the Fourier transform of the sought height map Z is obtained:

$$\mathcal{F}(Z) = -\frac{i\omega_x \mathcal{F}(p) + i\omega_y \mathcal{F}(q)}{(\omega_x^2 + \omega_y^2)} \qquad (30)$$

and the surface itself is computed by the inverse Fourier transform:

$$Z = \mathcal{F}^{-1}\left(-\frac{i\omega_x \mathcal{F}(p) + i\omega_y \mathcal{F}(q)}{(\omega_x^2 + \omega_y^2)}\right) \qquad (31)$$

In practice, either Digital Fourier Transform (DFT) or the Digital Cosine Transform (DCT) can be used for computing the topography in the method described above.

In the context of the current invention (with multiple detector configurations) one can also add a surface reconstruction step following the fusion step set forth in the previous Bayesian Fusion section. Once the parameters β and S are recovered, one can substitute β into the system of equations for computing normals, leading to:

$$\begin{cases} \beta_1(i) = K_1(i)(l_x^1(i) \cdot n_x(i) + l_y^1(i) \cdot n_y(i) + l_z^1(i) \cdot n_z(i)) \\ \beta_2(i) = K_2(i)(l_x^2(i) \cdot n_x(i) + l_y^2(i) \cdot n_y(i) + l_z^2(i) \cdot n_z(i)) \\ \beta_3(i) = K_3(i)(l_x^3(i) \cdot n_x(i) + l_y^3(i) \cdot n_y(i) + l_z^3(i) \cdot n_z(i)) \end{cases} \qquad (32)$$

where the number of unknowns has increased to 6 (5 independent ones) and the terms $K_i$ are detector-related gain values. This system can be rewritten as:

$$\begin{cases} \beta_1(i) = \vec{K_1}(i) \cdot \vec{n}(i) \\ \beta_2(i) = \vec{K_2}(i) \cdot \vec{n}(i) \\ \beta_3(i) = \vec{K_3}(i) \cdot \vec{n}(i) \end{cases} \qquad (33)$$

One can use regularization-based optimization techniques to solve for this under-constrained system, using constraints: $\|\vec{n}(i)\| = 1$ and $$\frac{\vec{K_J}(i)}{\|\vec{K_J}(i)\|} = \vec{l}_j(i).$$

Another approach can rely on a calibration step using samples with known geometries and similar materials to solve for the $\vec{K_j}(i)$ variables, allowing a direct inversion of the system of equations (33). For more information on solving constrained systems of non-linear equations, reference is made to the following exemplary publications:

[6] William H. Press, Saul A. Teukolsky, William T. Vetterling, Brian P. Flannery, *Numerical Recipes in C: The Art of Scientific Computing*, Second Edition (1992).

[7] Werner C. Rheinboldt, *Methods for Solving Systems of Nonlinear Equations*, Second Edition, published by SIAM (1998) (ISBN0-8971-415-X)

4. Sample/Detector Positioning Strategy

Given that one can label occlusions for each set of detector configurations as set forth earlier, one can change the relative position/attitude of the sample, which leads to different distributions of the occluded areas. This can, for example, be done by systemically rotating and tilting the sample holder (stage) at regular steps, which will resolve many of the occlusions. Another approach can use the computed topography. If the surface is known and calibrated to an absolute measurement, one can find the actual occluding surfaces for a given detector, and program the stage to move and tilt such that the region of interest is visible to this detector.

5. Image Registration

The step of image registration is only needed when fusing images that were not acquired during the same measurement session (e.g. scan, in the case of a SEM). This task is common to a number of fusion problems, and consists mainly of finding the spatial transformations that will align the coordinate frames of the images such that pixels in one image map to their corresponding ones in the other image. Manual or semiautomated registration relies on manually selecting corresponding landmark points in the images and computing aligning transforms based on the list of matches. Automated registration on the other hand requires the use of a similarity measure that is maximized when the correspondence is reached. For multimodal datasets, the Mutual Information criterion is commonly used as a similarity measure. The type of transformations that can be used to model image-to-image mapping range from rigid to affine to non-rigid transformations (including spline-based ones). These transformations account for sample motion between measurement sessions (scans) as well as for distortions due to drift, vibrations and other nuisances. Registration consists of searching the transformation space for values that maximize the similarity measure. Such optimization can be achieved using gradient-based techniques for example. A wide range of registration techniques with different similarity criteria, image transformations and optimization approaches are, for example, elucidated in the following reference:

[8] B. Zitova, and J. Flusser, *Image registration methods: A survey*, Image and Vision Computing, Vol. 21, pp. 997-1000, 2003.

Embodiment 3

Figure 2:
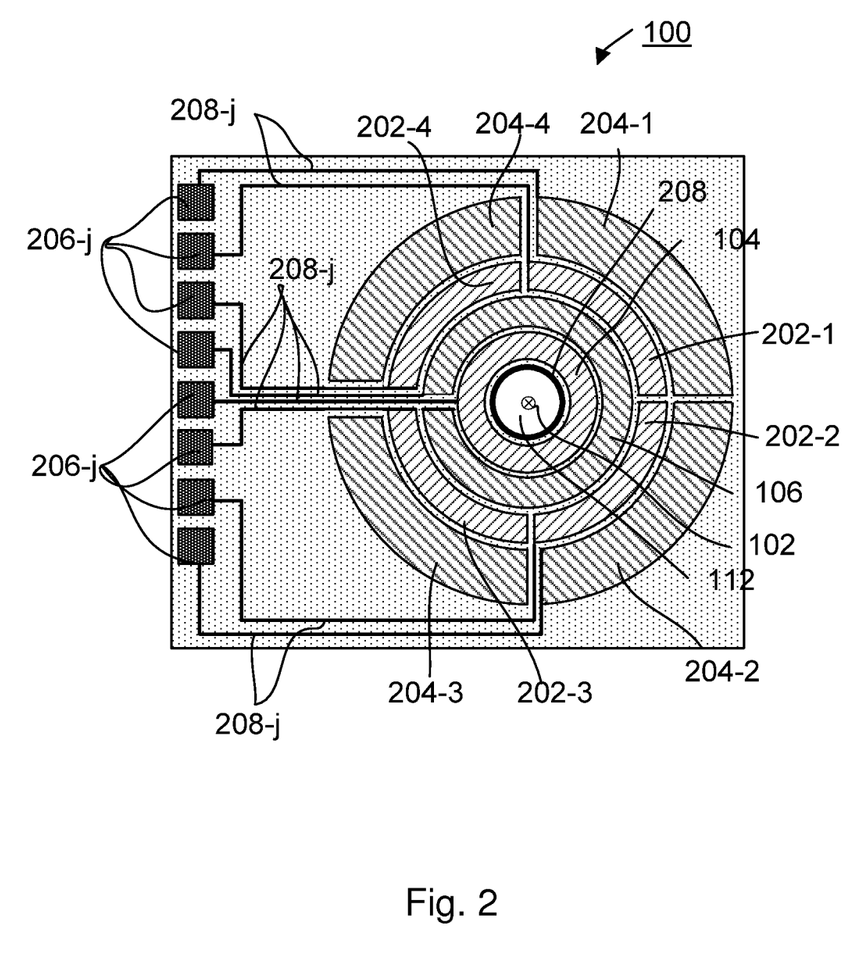
FIG. 2 renders a plan view (bottom view) of aspects of an electron detector suitable for use in the present invention.

FIG. 2 renders a schematic plan view (bottom view) of aspects of a segmented solid-state detector 100 suitable for use in the present invention. In this particular case, the depicted detector 100 is suitable for measuring electrons (both SEs and BEs) in a so-called quadrant configuration. As will become evident from the following elucidation, such a detector allows capture of emitted electrons emanating from a sample in a broad range of directions (simultaneous multiple detector configurations), and allows such detection to occur in a spatially resolved fashion.

As here depicted, detector 100 is provided with a through-hole 112 which is centred about an axis 102 perpendicular to the drawing. In use, this axis 102 will generally coincide with the optical axis of the charged-particle microscope in which the detector 100 is mounted. When used in a SEM, there may be no need for such a central hole 112; on the contrary, the presence of such a hole might only cause an area of the detector to be 'blind' to electrons emanating from a sample under investigation. However, in a TEM, there is often a need to detect electrons that are deflected/scattered through an angle larger than a predefined threshold value, but to allow electrons scattered through a smaller angle to pass through the through-hole 112 and be imaged by imaging optics of the TEM.

The detector 100 comprises annular detector areas 104 and 106, in nested arrangement. In addition, four detector areas 202-$i$ ($i$=1 . . . 4) are arranged in annular configuration around the annular detector area 106, and four detector areas 204-$i$ are similarly disposed around detector areas 202-$i$. The detector 100 further comprises a number of connection pads 206-$j$, which allow detection of a signal from each detector area ($j$=0 . . . N, N being the total number of detector areas on the detector 100, with one of the pads being connected to a common electrode formed on the backside of the detector 100). Each connection pad 206-$j$ is connected to its corresponding detector area via a conductive track 208-$j$.

Structural details of such a detector 100 can be gleaned, for example, from co-pending European patent application EP 11150672. However, a brief description of the detector's structure will be given here.

The detector 100 is disposed on an n-type substrate (e.g. an n-doped silicon substrate with a typical volume resistivity of about 1-10 Ω·cm), which is metallized on one side so as to form said common backside electrode. On the front side of this substrate (depicted in FIG. 2), an intrinsic layer (active layer) in the form of an epitaxial Si layer is formed (e.g. with a thickness of 40 μm). On top of this epitaxial layer, a boron layer is deposited, whereby a p$^+$-type diffusion layer of silicon-boride layer is created. Enclosing the various radiation-sensitive detector areas 104, 106, 202-$i$, 204-$i$, p-doped (e.g. boron-doped) boundaries are formed. Said detector areas are electrically insulated from each other by an interposed n-doped implant area (e.g. with a phosphorus dopant) that, together with said p-doped areas, forms a p-n-p barrier between said detector areas. Part of said epitaxial layer is covered by a layer of silicon dioxide, upon which aluminium tracks are formed for the purpose of transporting the signals from said detector areas (ultimately connecting to tracks 208-$j$ in FIG. 2). A signal from each detector area 104, 106, 202-$i$, 204-$i$ can be registered by measuring the current/voltage induced between said common backside electrode and the specific aluminium track of the detector area in question.

Each detector area thus constitutes a so-called "P-I-N diode", formed by said p$^+$-diffusion layer, intrinsic layer, and n-doped substrate. Any holes in the intrinsic layer will travel to the p$^+$-layer, and any electrons in the intrinsic layer will travel to the n-doped substrate. Electron/hole pairs generated in the intrinsic layer will thus induce a current. Such electron/hole pairs are, for example, generated in a sample by impinging electrons (from an incoming electron beam), whereby the number of generated electron/hole pairs will be proportional to the energy with which the electrons enter the intrinsic layer and inversely proportional to the energy needed to form an electron/hole pair.

In operation, a beam of electrons (or ions) is directed along the axis 102 from the backside of the detector through the through-hole 112 onto a sample situated at the front (radiation-sensitive) side of the detector 100. At the sample, SEs and BEs will be liberated by the impinging electron beam. SEs are often categorized as electrons that emerge from the sample with an energy less than 50 eV, while BEs are generally categorized as electrons emerging from the sample with an energy in excess of 50 eV. Preferably, the detector 100 is maintained at a slight positive potential with respect to said sample, by electrically biasing the sample or the detector; in this way, SEs will be accelerated towards the detector. In general, SEs will be detected quite close to the axis 102, as they have relatively little energy radial to the axis, whereas BEs will be detected by the detector areas further removed from the axis 102, as BEs often have more significant radial energy to start off with.

As set forth above, the detector areas more distal from the axis 102 are segmented into four 90° segments. By comparing the signals induced in different such segments (and also by comparing the signal from different annuli), one can effectively spatially resolve the electrons emanating from the sample. By applying the mathematical techniques of the current invention to process these various signals, one can deduce surface occlusion/topographical information with regard to the sample under investigation.

Embodiment 4

Figure 3:
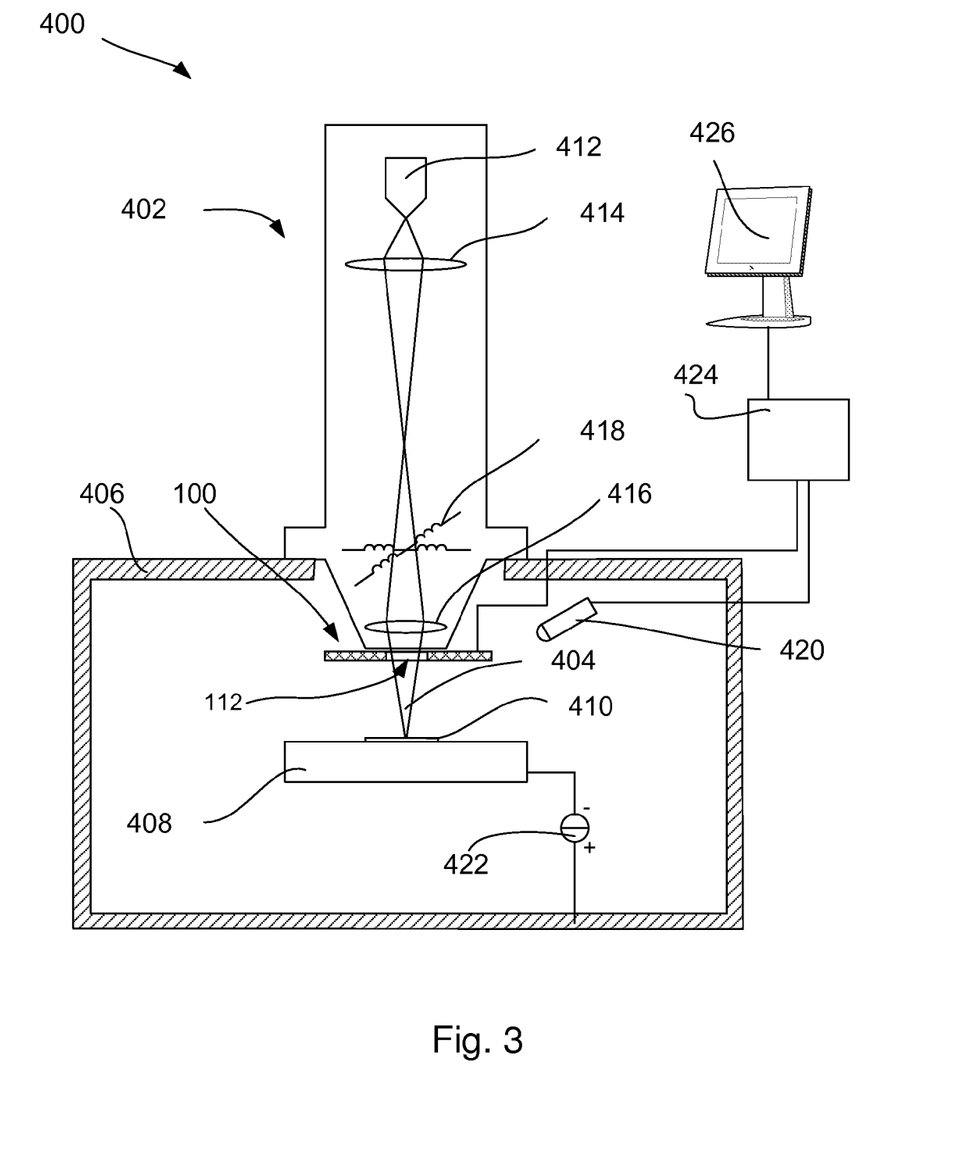
FIG. 3 renders a longitudinal cross-sectional view of aspects of a particle-optical microscope (in this case a SEM) with which the method according to the current invention can be implemented.

FIG. 3 shows a charged-particle microscope 400, which, in this case, is a SEM. The microscope 400 comprises a particle-optical column 402, which produces a charged-particle beam 404 (in this case, an electron beam). The particle-optical column 402 is mounted on a vacuum chamber 406, which comprising a sample holder/stage 408 for holding a sample 410. The vacuum chamber 406 is evacuated using vacuum pumps (not depicted). The sample holder 408, or at least the sample 410, may be biased (floated) to an electrical potential with respect to ground, with the aid of voltage source 422.

The particle-optical column 402 comprises an electron source 412, lenses 414, 416 to focus the electron beam 404 onto the sample 410, and a deflection unit 418. The apparatus is further equipped with a first detector 420, for detecting a first type of emitted radiation emanating from the sample 410 in response to irradiation by the beam 404; in the present example, the detector 420 is, for example, an X-ray detector (such as an EDS or WDS detector) for detecting X-rays. Also depicted is a second detector 100, for detecting a second type of emitted radiation emanating from the sample 410 in response to irradiation by the beam 404; in the present example, the detector 100 is, for example, a segmented electron detector as set forth in Embodiment 3 above. The apparatus further comprises a computer processing apparatus (controller) 424 for controlling inter alia the deflection unit 418, lenses 414, and detectors 420,100, and displaying information gathered from the detectors 420,100 on a display unit 426.

By scanning the beam 404 over the sample 410, emitted radiation—comprising, for example, X-rays, secondary electrons (SEs) and backscattered electrons (BEs)—emanates from the sample 410. X-rays are detected by first detector 420, whereas SEs/BEs are detected by second detector 100. As the emitted radiation is position-sensitive (due to said scanning motion), the information obtained from the detectors 420, 100, will also be position-dependent.

The signals from the detectors 420,100 are processed by the processing apparatus 424, and displayed on display unit 426. Such processing may include combining, integrating, subtracting, false colouring, edge enhancing, and other processing known to the person skilled in the art. In addition, automated recognition processes, e.g. as used for particle analysis, may be included in such processing. In the context of the current invention, the processing apparatus 424 will additionally perform tasks such as:

- Bringing members of the set $S_I$ into mutual registration/alignment, e.g. by applying a suitable mathematical transform to correct shift/scaling/rotation, etc.
- Calculating a fused image $I_F$, using the (mutually registered) members of $S_I$ as input.
- Determining regions of occlusion in the members of $S_I$.
- Calculating surface topography of the sample that is the cause of the observed occlusion.
- Making suggestions as regards detector configurations that can best be used or avoided so as to optimally cope with a given region of occlusion. etc.

It should be noted that many refinements and alternatives of such a set-up will be known to the skilled artisan, including, but not limited to, the detection of (infrared/visible/ultraviolet) light emanating from the sample 410, the use of dual beams (for example an electron beam 404 for imaging and an ion beam for machining (or, in some cases, imaging the sample 410), the use of a controlled environment at the sample 410 (for example, maintaining a pressure of several mbar—as used in a so-called Environmental SEM—or by admitting gasses, such as etching or precursor gasses), etc.

We claim as follows:

1. A method of examining a sample using a charged-particle microscope, comprising the following steps:
    Mounting the sample on a sample holder;
    Using a particle-optical column to direct at least one beam of particulate radiation onto the sample, thereby producing an interaction that causes emitted radiation to emanate from the sample;
    Using a first detector configuration $C_1$ to detect a first portion of the emitted radiation and produce a first image $I_1$ based thereupon;
    Using at least a second detector configuration $C_2$ to detect a second portion of the emitted radiation and produce a second image $I_2$ based thereupon, whereby $C_2$ is different to $C_1$, thus compiling a set $S_D=\{C_1, C_2\}$ of detector configurations and a set $S_I=\{I_1, I_2\}$ of corresponding images;
    Using computer processing apparatus to automatically compare different members of $S_I$ and mathematically identify on the sample at least one occlusion region with an occluded line of sight relative to at least one member of $S_D$.

2. A method as claimed in claim 1, wherein members of $S_D$ differ from one another in at least one of the following manners:
    Each employs a different detector in a different fixed position with respect to the sample holder;
    Each employs the same detector, but moved into a different relative position with respect to the sample.

3. A method as claimed in claim 1, wherein one or more different extra detector configurations $C_i$ are used to produce corresponding extra images $I_i$, thus serving to increase the cardinality of the sets $S_D$ and $S_I$.

4. A method as claimed in claim 1, wherein:
    Plural members of $S_I$ are mathematically fused into a composite reference image $I_F$;
    At least one test image $I_T$ is selected from $S_I$;
    Said occlusion region is identified using a technique that comprises comparing $I_F$ to $I_T$ and identifying an area in $I_T$ in which at least one of the following is observed:
    A reduced correlation between $I_T$ and $I_F$;
    A reduced intensity in $I_T$ relative to $I_F$.

5. A method as claimed in claim 4, wherein, in addition to comparing $I_T$ to $I_F$, $I_T$ is also compared to a different member $I'_T$ of $S_I$.

6. A method as claimed in claim 1, wherein, for a given region R on the sample, the computer processing apparatus automatically performs at least one of the following actions:
    Indicate a member of the set $S_D$ that suffers from greatest occlusion in respect of R;
    Indicate a member of the set $S_D$ that suffers from least occlusion in respect of R;
    Infer a new detector configuration C' that is not an existing member of $S_D$ and that is predicted to give lower occlusion in respect of R than any existing member of $S_D$.

7. A method as claimed in claim 1, wherein the computer processing apparatus calculates at least partial surface topography of the sample associated with said at least one occlusion region.

8. A method as claimed in claim 1, in which at least two different members of $S_D$ are used to correspondingly detect at least two different types of emitted radiation.

9. A method as claimed in claim 8, wherein said at least two different types of emitted radiation comprise X-rays in one case and electrons in the other case.

10. A charged-particle microscope constructed and arranged to perform a method as claimed in claim 1.

11. The method of claim 1 to automatically infer the presence of an occluded region in a given test image $I_T$, comprising the steps of:
    comparing $I_T$ to another image $I'_T$ (both in SI), whereby both images $I_T$ and $I'_T$ (at least partially) pertain to the same portion of the sample S, and, if necessary, are first mutually translated/scaled/rotated (i.e. brought into mutual "registration") so as to allow one to be accurately aligned with/superimposed upon the other; and observing the occluded region in $I_T$ via an area of reduced correlation between $I_T$ and $I'_T$ or an area of reduced intensity in $I_T$ relative to $I'_T$.

\* \* \* \* \*